(12) United States Patent
Kawabe et al.

(10) Patent No.: US 9,069,921 B2
(45) Date of Patent: Jun. 30, 2015

(54) VERIFICATION APPARATUS FOR SEMICONDUCTOR INTEGRATED CIRCUIT, VERIFICATION METHOD FOR SEMICONDUCTOR INTEGRATED CIRCUIT, AND PROGRAM THEREFOR

(71) Applicant: Kabushiki Kaisha Toshiba, Minato-ku, Tokyo (JP)

(72) Inventors: Naoyuki Kawabe, Yokosuka (JP); Tetsuaki Utsumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/203,345

(22) Filed: Mar. 10, 2014

(65) Prior Publication Data

US 2015/0074625 A1    Mar. 12, 2015

(30) Foreign Application Priority Data

Sep. 10, 2013    (JP) .................................. 2013-187085

(51) Int. Cl.
*G06F 9/455*    (2006.01)
*G06F 17/50*    (2006.01)

(52) U.S. Cl.
CPC .................................... *G06F 17/505* (2013.01)

(58) Field of Classification Search
USPC ........................................ 716/106, 107, 111
See application file for complete search history.

(56) References Cited

U.S. PATENT DOCUMENTS

| | | | |
|---|---|---|---|
| 6,256,604 B1 * | 7/2001 | Yabe et al. ...................... 703/14 |
| 6,490,710 B1 * | 12/2002 | Wada ............................. 716/107 |
| 7,107,190 B1 * | 9/2006 | Tsuchiya et al. .................. 703/1 |
| 8,346,528 B2 * | 1/2013 | Joshi et al. ...................... 703/14 |
| 2007/0028204 A1 | 2/2007 | Takeda |
| 2010/0008155 A1 * | 1/2010 | Mukund et al. .......... 365/189.02 |
| 2010/0333053 A1 * | 12/2010 | Goto ............................. 716/106 |
| 2014/0192583 A1 * | 7/2014 | Rajan et al. ..................... 365/63 |

FOREIGN PATENT DOCUMENTS

| | | |
|---|---|---|
| JP | 2001-085641 A | 3/2001 |
| JP | 3682188 B2 | 8/2005 |
| JP | 2007-034584 A | 2/2007 |
| JP | 2008-059032 A | 3/2008 |

OTHER PUBLICATIONS

N. Kawabe and K. Usami, "Low-Power Technique for On-Chip Memory Using Biased Partitioning and Access Concentration," IEEE Custom Integrated Circuits Conference 2000(CICC'00), pp. 275-278, May 2000.

* cited by examiner

*Primary Examiner* — Brian Ngo
(74) *Attorney, Agent, or Firm* — Knobbe, Martens, Olson & Bear, LLP

(57) ABSTRACT

The verification apparatus for a semiconductor integrated circuit verifies a logic equivalence before and after modification to the circuit by replacing a memory with a divisional memory model that agrees with the memory in number of input and output pins and verifying logics at an input and an output thereof.

12 Claims, 5 Drawing Sheets

VERIFICATION APPARATUS FOR SEMICONDUCTOR INTEGRATED CIRCUIT, VERIFICATION METHOD FOR SEMICONDUCTOR INTEGRATED CIRCUIT, AND PROGRAM THEREFOR

CROSS-REFERENCE TO RELATED APPLICATION

This application is based upon and claims the benefit of priority from the prior Japanese Patent Application No. 2013-187085, filed on Sep. 10, 2013, the entire contents of which are incorporated herein by reference.

BACKGROUND

1. Field

Embodiments described herein relate generally to a verification apparatus for a semiconductor integrated circuit, a verification method for a semiconductor integrated circuit, and a program therefore.

2. Background Art

According to prior art, if sub-banking of a memory is performed, a logic simulation needs to be performed for logic verification. In particular, in the case of a large-scale integrated circuit, gate level simulation takes a very long time, so that even resister transfer level (RTL) simulation needs to be performed. Even after the RTL simulation, a series of design operations including logic synthesis and test circuit insertion takes a long time.

Therefore, it is not practical to perform sub-banking of a memory after logic simulation and logic verification.

DETAILED DESCRIPTION

A verification apparatus for a semiconductor integrated circuit according to an aspect of the present invention verifies a logic equivalence before and after modification to the circuit by replacing a memory with a divisional memory model that agrees with the memory in number of input and output pins and verifying logics at an input and an output thereof.

First Embodiment

In the following, an embodiment will be described with reference to the drawings.

Figure 1:
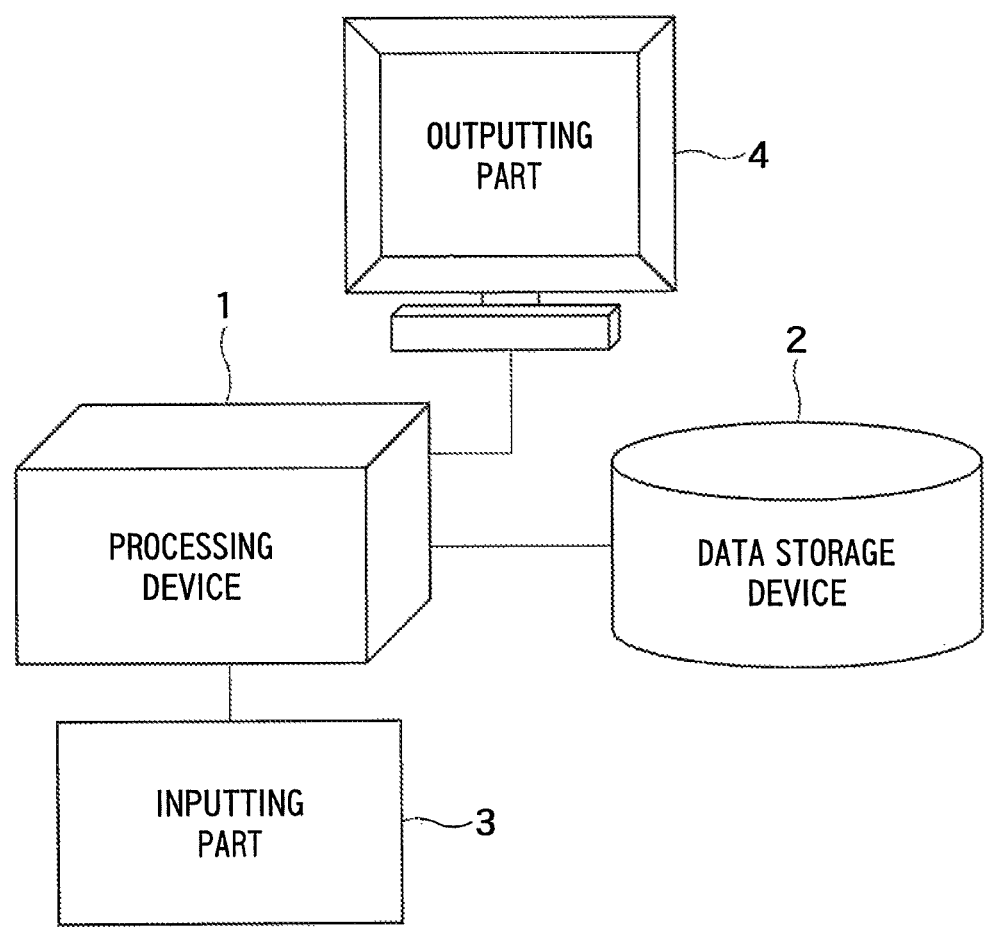
FIG. 1 is a diagram showing a configuration of a verification apparatus 100 for a semiconductor integrated circuit according to a first embodiment, which is an aspect of the present invention.

FIG. 1 is a diagram showing a configuration of a verification apparatus 100 for a semiconductor integrated circuit according to a first embodiment, which is an aspect of the present invention.

As shown in FIG. 1, the verification apparatus 100 for a semiconductor integrated circuit includes a processing device (a computer) 1, a data storage device 2, an inputting part 3 and an outputting part 4.

The inputting part 3 is selected from among a keyboard, a mouse, a recognition device such as an optical character reader (OCR), a graphics inputting device such as an image scanner, an external storage medium driving device for a floppy disk, a CD-R, a DVD, an USB memory or the like, a storage device connected to a network, and a special inputting device such as a sound recognition device, for example. Required information is input to the processing device 1 through the inputting part 3.

The outputting part 4 is selected from among a display device such as a liquid crystal display or a CRT display, a printing device such as an ink jet printer or a laser printer, an external storage medium driving device for a floppy disk, a CD-R, a DVD, an USB memory or the like and a storage device connected to a network, for example. Information processed by the processing device 1 is output from the outputting part 4.

The data storage device 2 stores a program to be executed by the processing device 1, such as a verification program for performing logic verification or formal verification or a designed RTL description or gate level net list. The data storage device 2 may be a hard disk, a floppy disk, a CD-R, a DVD, a USB memory or a storage device connected to a network.

If a memory such as a SRAM or a ROM is used in the semiconductor integrated circuit, the SRAM or ROM needs to be instantiated with the RTL or gate level net list to perform logic verification thereof by logic simulation. Sub-banking is then performed to divide a memory with a certain capacity into a set of a plurality of memories with smaller capacities.

According to prior art, if sub-banking is performed, logic simulation is performed again to perform logic verification. In general, the logic simulation takes a long time, so that the logic verification also takes a long time.

In view of such circumstances, according to this embodiment, as a method of verifying the logic equivalence before and after modification to a circuit, a formal verification method is adopted. According to the formal verification, the inside of the memory is treated as a black box, and the equivalence of the logic at an input and an output thereof is verified.

Figure 2:
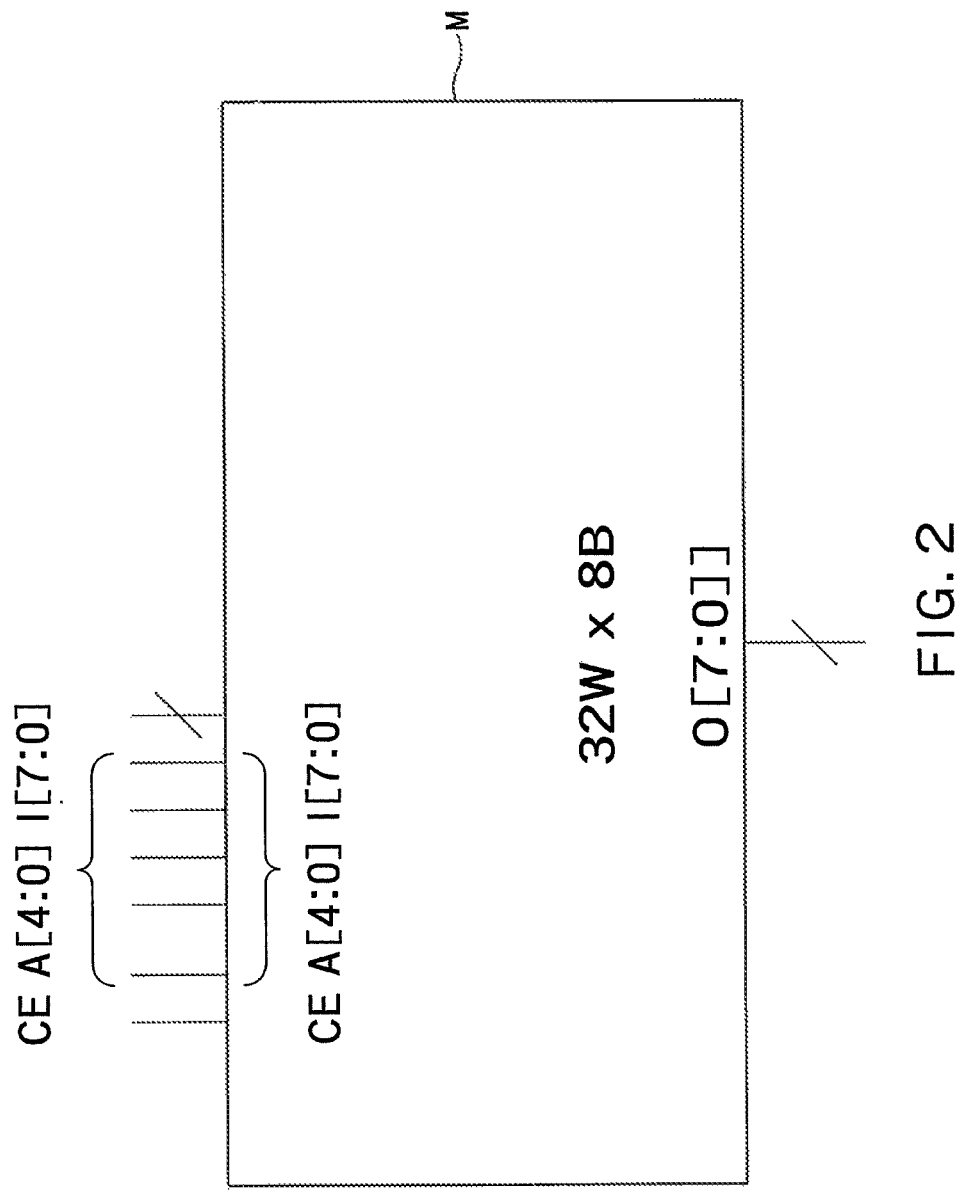
FIG. 2 is a block diagram showing an example of a configuration of a memory "M" used in the semiconductor integrated circuit.

FIG. 2 is a block diagram showing an example of a configuration of a memory "M" used in the semiconductor integrated circuit.

As shown in FIG. 2, the memory "M" receives a 1-bit chip enable signal "CE" that controls activation of a chip, a 5-bit address signal "A[4:0]" that designates an address of a memory cell of the memory "M" and an 8-bit input data signal "I[7:0]", and outputs an 8-bit output data signal "O[7:0]", for example.

As described above, the memory "M" is an SRAM, for example, and has a capacity of 32 words (W) by 8 bits (B). In this embodiment, the whole of the memory "M" is treated as a black box.

Figure 3:
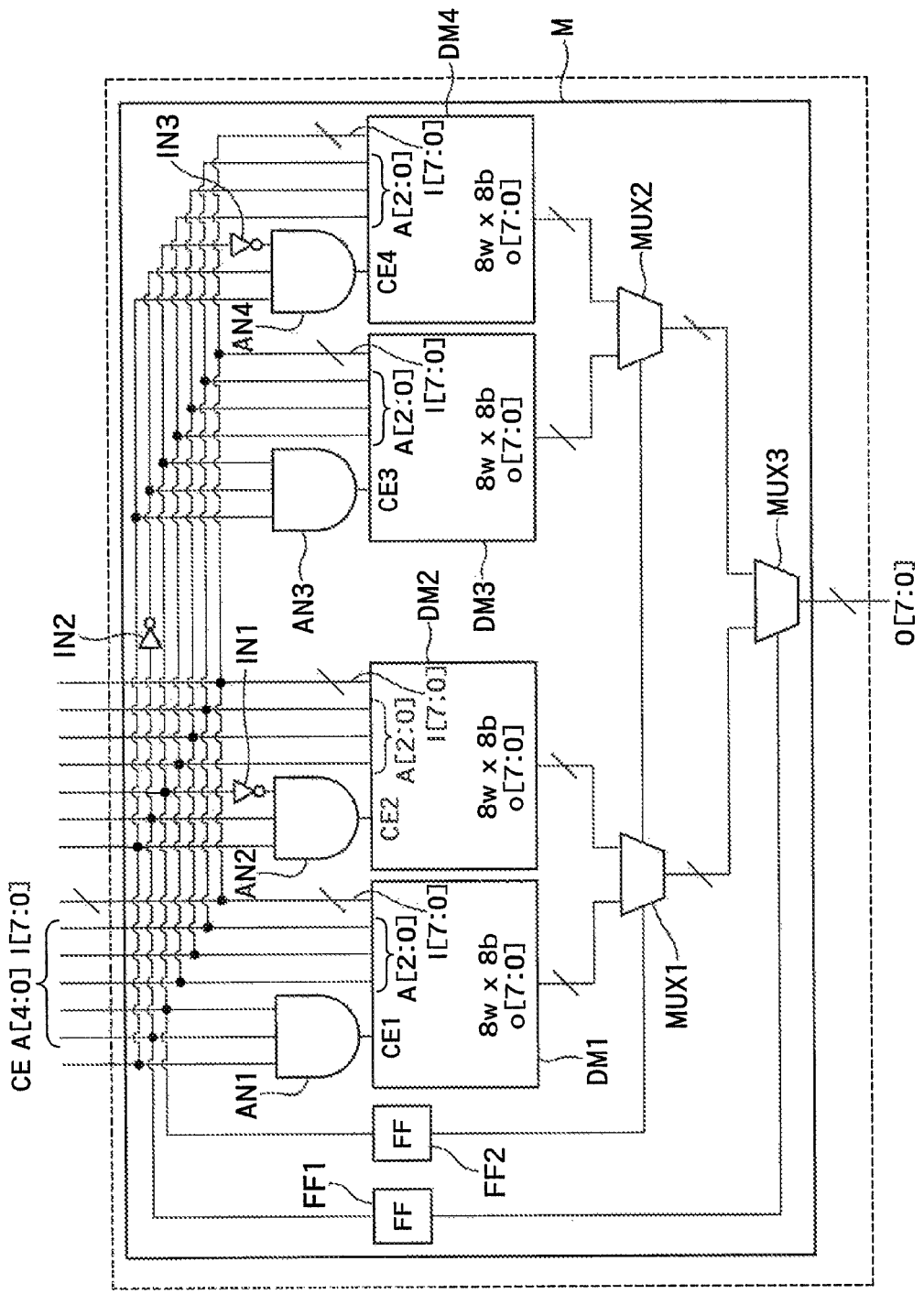
FIG. 3 is a block diagram showing an example of a divisional memory model for formal verification of the memory "M" shown in FIG. 2.

Next, an example of the divisional memory model for formal verification of the memory "M" shown in FIG. 2 will be described. FIG. 3 is a block diagram showing an example of a divisional memory model for formal verification of the memory "M" shown in FIG. 2.

As shown in FIG. 3, according to this embodiment, for example, for formal verification, the memory "M" is modeled by a model including a plurality of divisional memories "DM1" to "DM4" with a smaller capacity than the memory "M", a first logic circuit (AND circuits "AN1" to "AN4" and inverter circuits "IN1" to "IN3") that selects from among the plurality of divisional memories "DM1" to "DM4", flip-flop circuits (delay circuits) "FF1" and "FF2" that delay address signals "A[4]" and "A[3]" by one clock and output the resulting signals, and a second logic circuit (selecting circuits "MUX1" to "MUX3") that selects from among outputs of the divisional memories "DM1" to "DM4" according to the signals from the flip-flop circuits "FF1" and "FF2" and designates the selected output as an output of the whole of the memory.

The first logic circuit described above (the AND circuits "AN1" to "AN4" and the inverter circuits "IN1" to "IN3"), the flip-flop circuits "FF1" and "FF2" and the second logic circuit (the selecting circuits "MUX1" to "MUX3") can be implemented by any means that is logically correct.

The AND circuit "AN1" receives the chip enable signal "CE" and the address signals "A[3]" and "A[4]" and outputs a chip enable signal "CE1" that activates the divisional memory "DM1".

The divisional memory "DM1" has a capacity of 8 words (W) by 8 bits (B). The divisional memory "DM1" receives the chip enable signal "CE", an address signal "A[2:0]" and the input data signal "I[7:0]" and outputs the output data signal "O[7:0]".

The inverter circuit "IN1" receives the address signal "A[3]" and outputs a signal obtained by inverting the logic of the address signal "A[3]".

The AND circuit "AN2" receives the chip enable signal "CE", the signal obtained by inverting the logic of the address signal "A[3]" and the address signal "A[4]" and outputs a chip enable signal "CE2" that activates the divisional memory "DM2".

The divisional memory "DM2" has a capacity of 8 words (W) by 8 bits (B). The divisional memory "DM2" receives the chip enable signal "CE2", the address signal "A[2:0]" and the input data signal "I[7:0]" and outputs the output data signal "O[7:0]". The inverter circuit "IN2" receives the address signal "A[4]" and outputs a signal obtained by inverting the logic of the address signal "A[4]".

The AND circuit "AN3" receives the chip enable signal "CE", the signal obtained by inverting the logic of the address signal "A[4]" and the address signal "A[3]" and outputs a chip enable signal "CE3" that activates the divisional memory "DM3".

The divisional memory "DM3" has a capacity of 8 words (W) by 8 bits (B). The divisional memory "DM3" receives the chip enable signal "CE3", the address signal "A[2:0]" and the input data signal "I[7:0]" and outputs the output data signal "O[7:0]".

The inverter circuit "IN3" receives the address signal "A[3]" and outputs the signal obtained by inverting the logic of the address signal "A[3]".

The AND circuit "AN4" receives the chip enable signal "CE", the signal obtained by inverting the logic of the address signal "A[3]" and the signal obtained by inverting the logic of the address signal "A[4]" and outputs a chip enable signal "CE4" that activates the divisional memory "DM4".

The divisional memory "DM4" has a capacity of 8 words (W) by 8 bits (B). The divisional memory "DM4" receives the chip enable signal "CE4", the address signal "A[2:0]" and the input data signal "I[7:0]" and outputs the output data signal "O[7:0]".

The flip-flop circuit "FF1" receives the address signal "A[4]" and outputs a selection signal obtained by delaying the address signal "A[4]" by one clock.

The flip-flop circuit "FF2" receives the address signal "A[3]" and outputs a selection signal obtained by delaying the address signal "A[3]" by one clock.

The selecting circuit "MUX1" selects one of the output data signals "O[7:0]" output from the divisional memories "DM1" and "DM2" according to the selection signal obtained by delaying the address signal "A[3]" by one clock and outputs the selected signal.

The selecting circuit "MUX2" selects one of the output data signals "O[7:0]" output from the divisional memories "DM3" and "DM4" according to the selection signal obtained by delaying the address signal "A[3]" by one clock and outputs the selected signal.

The selecting circuit "MUX3" selects one of the output data signals "O[7:0]" output from the selecting circuits "MUX1" and "MUX2" according to the selection signal obtained by delaying the address signal "A[4]" by one clock and outputs the selected signal. The output of the selecting circuit "MUX3" is the output of the memory "M".

The plurality of divisional memories "DM1" to "DM4" are treated as a black box having a capacity of 8 words (W) by 8 bits (B).

As described above, according to this embodiment, one memory "M" is turned into a soft macro as divisional memories "DM1" to "DM4" having a smaller capacity. By turning the memory "M" into a soft macro, the memory "M" can be replaced with a divisional memory model that agrees with the memory "M" in number of input and output pins.

Although one memory "M" is divided into four divisional memories "DM1" to "DM4" in the example shown in FIG. 3, the present invention is not limited to the configuration, and the memory "M" can be divided into any number of divisional memories.

Next, an example of a sub-banked configuration of the model of the memory "M" for formal verification will be described. In the following, an example will be described in which the model of the memory "M" shown in FIG. 3 described above is divided into two sub-banks in the word direction.

Figure 4:
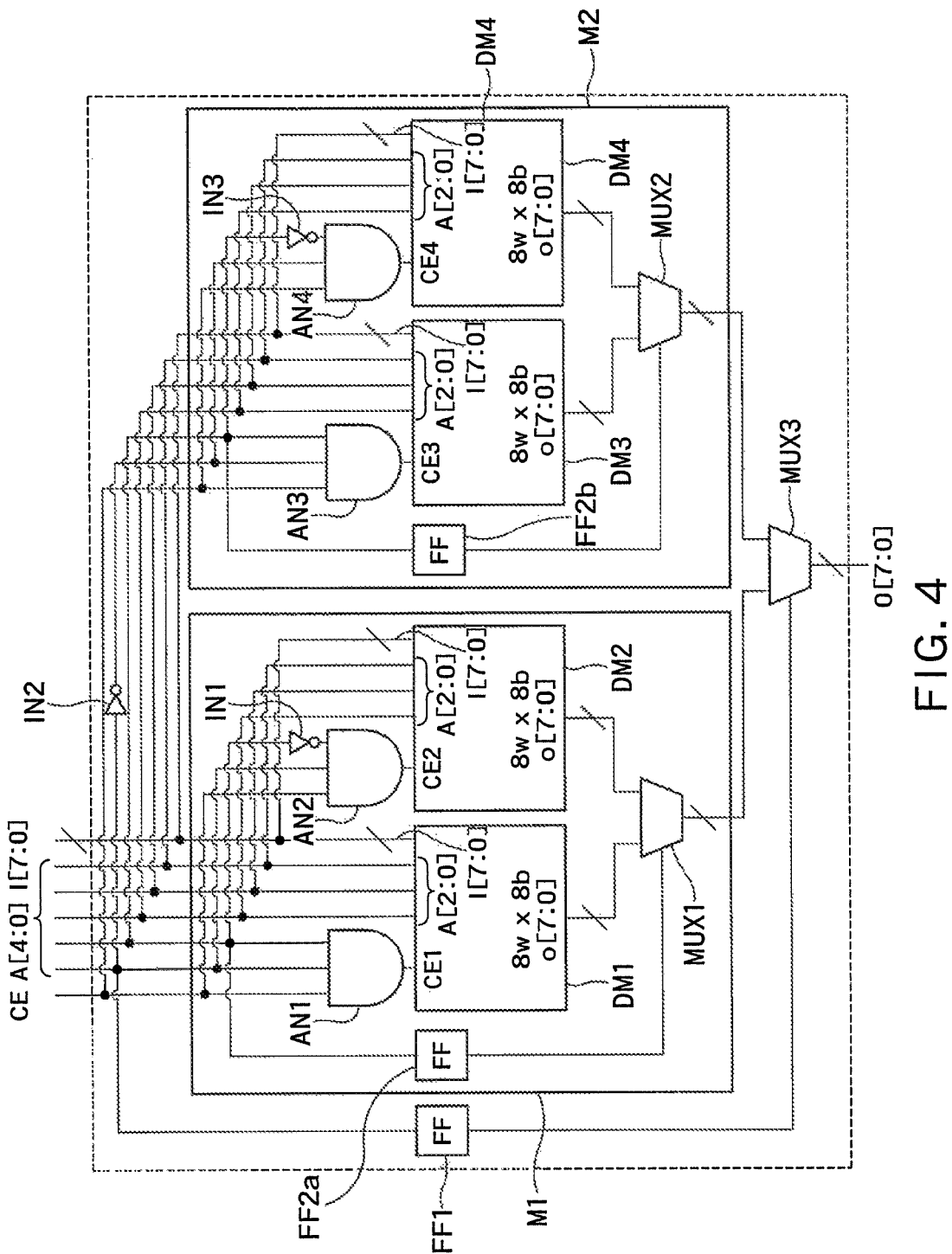
FIG. 4 is a block diagram showing an example of a sub-banked configuration of the model of the memory "M" shown in FIG. 3.

FIG. 4 is a block diagram showing an example of a sub-banked configuration of the model of the memory "M" shown in FIG. 3. In FIG. 4, the same reference symbols as those in FIG. 3 denote the same components as those in FIG. 3.

As shown in FIG. 4, as a result of sub-banking, the memory "M" is divided into a plurality of (two, in this example) sub-banks "M1" and "M2". That is, the sub-banked memory "M" includes the sub-banks "M1" and "M2", the inverter circuit "IN2", the flip-flop circuit "FF1" and the selecting circuit "MUX3".

The sub-bank "M1" includes the AND circuits "AN1" and "AN2", the inverter circuit "IN1", a flip-flop circuit "FF2a" that delays the address signal "A[3]" by one clock, and the selecting circuit "MUX1" that selects from among the outputs of the divisional memories "DM1" and "DM2" according to the signal from the flip-flop circuit "FF2a" and outputs the selected signal.

The sub-bank "M2" includes the AND circuits "AN3" and "AN4", the inverter circuit "IN3", a flip-flop circuit "FF2b" that delays the address signal "A[3]" by one clock, and the selecting circuit "MUX2" that selects from among the outputs of the divisional memories "DM1" and "DM2" according to the signal from the flip-flop circuit "FF2b" and outputs the selected signal.

The number of input and output pins of the divisional memories "DM1" to "DM4" of the model of the memory "M" (a library for Formal Verification (an FV library)) yet to be sub-banked shown in FIG. 3 is equal to the number of input and output pins of the model of the memory "M" (the FV library) sub-banked shown in FIG. 4.

In the model of the memory "M" (the FV library) yet to be sub-banked shown in FIG. 3, there are two flip-flop circuits "FF1" and "FF2". On the other hand, in the model of the memory "M" (the FV library) sub-banked shown in FIG. 4, there are three flip-flop circuits. The flip-flop circuits "FF2a" and "FF2b" in the memory library shown in FIG. 4 are cells having equivalent logics of the input and output signals.

In view of this, if the cells of these flip-flop circuits "FF2a" and "FF2b" are regarded as one cell, the number of input and output pins in the FV library of the model of the memory "M" sub-banked shown in FIG. 4 remains unchanged. In formal verification, clone cell information for treating a selecting circuit whose input and output logics of the memory "M" sub-banked remain unchanged as one cell is previously prescribed.

In this way, points of comparison between the model of the memory "M" sub-banked and the model of the memory "M" yet to be sub-banked agree with each other, so that the formal verification of the circuit yet to be sub-banked shown in FIG. 3 and the circuit sub-banked shown in FIG. 4 can be performed.

As described above, in the example shown in FIG. 4, a sub-banked configuration of the memory "M" has been described in which the memory "M" is divided into the sub-bank "M1" including two divisional memories "DM1" and "DM2" and the sub-bank "M2" including two divisional memories "DM3" and "DM4". As an alternative, however, the memory "M" can have a sub-banked configuration in which the memory "M" is divided into sub-banks including different numbers of divisional memories, such as a sub-banked configuration in which the memory "M" is divided into a sub-bank including one divisional memory and a sub-bank including three divisional memories.

As described above, if the divisional memory model for formal verification according to this embodiment is used, formal verification before and after sub-banking of the memory can be performed, and the time required for logic verification can be substantially reduced.

In addition, sub-banking of the memory or modification to the bank configuration of the memory after logic simulation can be performed. In particular, in layout designing, a memory can be sub-banked, or the bank configuration of a sub-banked memory can be modified, in order to use an available region in the floor plan to reduce the chip area.

Next, an example of a verification method for a semiconductor integrated circuit according to the first embodiment will be described.

Figure 5:
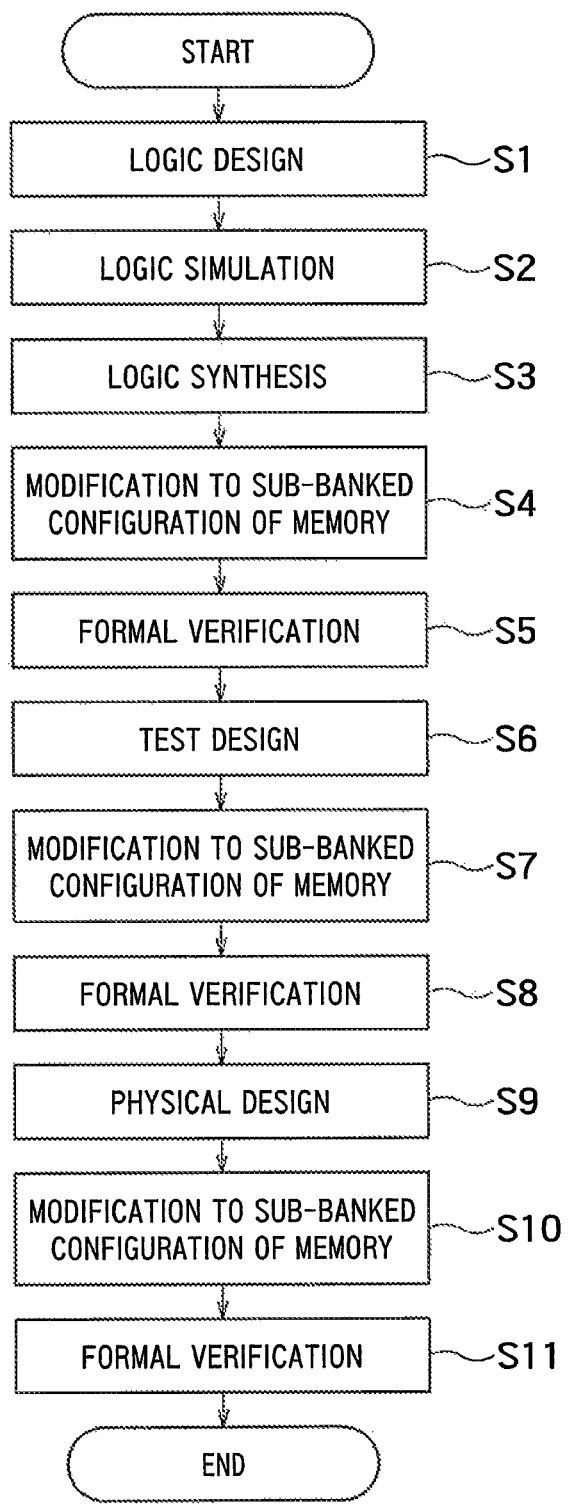
FIG. 5 is a flowchart for illustrating an example of a verification method for a semiconductor integrated circuit performed by the verification apparatus 100 according to the first embodiment shown in FIG. 1.

FIG. 5 is a flowchart for illustrating an example of a verification method for a semiconductor integrated circuit performed by the verification apparatus 100 according to the first embodiment shown in FIG. 1. The steps described below are performed by the processing device 1 (a computer) under the control of the program stored in the data storage device 2.

As shown in FIG. 5, the processing device 1 first performs logic design to design a resister transfer level (RTL) description of an operation of the semiconductor integrated circuit (Step "S1").

In designing the RTL description, for example, as shown in FIG. 3 described above, one memory "M" is modeled by a model including the plurality of divisional memories "DM1" to "DM4" with a smaller capacity than the memory that are addressed by a part "A[2:0]" of the address signal "A[4:0]" that designates the address of the memory "M", the first logic circuit (the AND circuits "AN1" to "AN4" and the inverter circuits "IN1" to "IN3") that selects from among the plurality of divisional memories "DM1" to "DM4" according to the remaining parts "A[4]" and "A[3]" of the address signal "A[4:0]", the delay circuits "FF1" and "FF2" that delay the remaining parts "A[4]" and "A[3]" of the address signal "A[4:0]" by one clock and output the resulting signals, and the second logic circuit (the selecting circuits "MUX1" to "MUX3") that selects from among the outputs of the divisional memories "DM1" to "DM4" according to the signals from the delay circuits "FF1" and "FF2" and designates the selected output as the output of the whole of the memory.

The model of the memory "M" is then sub-banked into a sub-banked configuration in which the memory "M is divided into a plurality of sub-banks, such as the sub-banks "M1" and "M2" shown in FIG. 4 described above, one of which includes some of the plurality of divisional memories "DM1" to "DM4", and the other of which includes the other divisional memories, for example.

The RTL description is typically written in a well-known design language, such as Veriog-HDL or VHDL. However, the present invention is not limited to these languages.

The processing device 1 then performs logic simulation of the designed RTL description and the gate level net list to verify whether the operations thereof are in conformity with operation specifications shown by a prescribed property (Step "S2").

The processing device 1 then performs logic synthesis to map the designed RTL description and the gate level net list to a logic gate to optimize timing, area and power consumption (Step "S3").

The processing device 1 performs modification to the sub-bank configuration if modification to the sub-bank configuration of the memory is needed in the logic synthesis described above (Step "S4").

The processing device 1 then performs formal verification to verify the logic equivalence of the RTL description and the net list resulting from the logic synthesis described above (Step "S5").

The processing device 1 then performs test design to insert a test circuit in the semiconductor integrated circuit in order to facilitate a test (Step "S6").

The processing device 1 modifies the sub-bank configuration if modification to the sub-bank configuration of the memory is needed as a result of the test design (Step "S7").

The processing device 1 then performs formal verification to verify the logic equivalence of the net lists before and after the test design (Step "S8").

The processing device 1 then performs physical design to arrange a logic gate, generate a clock tree and install wiring (Step "S9").

The processing device 1 modifies the sub-bank configuration if modification to the sub-bank configuration of the memory is needed as a result of the physical design (Step "S10").

The processing device 1 then performs formal verification of the logic equivalence of the net lists before and after the physical design (Step "S11").

Through the steps described above, verification of the semiconductor integrated circuit by the processing device 1 is completed. That is, the verification apparatus 100 for a semiconductor integrated circuit verifies the logic equivalence before and after modification to the circuit resulting from sub-banking of a memory "M" by replacing the memory "M" with a divisional memory model that agrees with the memory "M" in number of input and output pins and verifying the logics at inputs and outputs of the memory "M".

As described above, by using the memory model for formal verification according to the first embodiment, formal verification before and after sub-banking of a memory can be performed. As a result, the time required for logic verification can be substantially reduced, so that the memory can be sub-banked or the sub-bank configuration of the memory can be modified after logic simulation.

As described above, according to the verification method for a semiconductor integrated circuit according to this embodiment, the verification time can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A verification apparatus for a semiconductor integrated circuit, comprising:
    a processor that verifies a logic equivalence before and after modification to the circuit by:
        replacing a memory with a divisional memory model that agrees with the memory in number of input and output pins, wherein the divisional memory model comprises a plurality of divisional memories that have a smaller capacity than the memory and are addressed by a part of an address signal that designates an address of the memory; and
        verifying logics at an input and an output of the circuit.

2. The verification apparatus for a semiconductor integrated circuit according to claim 1, wherein the divisional memory model comprises:
    a first logic circuit that selects from among the plurality of divisional memories according to a remaining part of the address signal;
    a delay circuit that delays the remaining part of the address signal and outputs the resulting signal; and
    a second logic circuit that selects an output among outputs of the divisional memories according to the signal from the delay circuit and designates the selected output as an output of the whole of the plurality of divisional memories.

3. The verification apparatus for a semiconductor integrated circuit according to claim 2, wherein in the verification, the second logic circuit whose input and output logics of the memory sub-banked remain unchanged is treated as one cell.

4. The verification apparatus for a semiconductor integrated circuit according to claim 2, wherein the delay circuit is a flip-flop circuit.

5. A verification method for a semiconductor integrated circuit, the method comprising:
    verifying, by a verification apparatus comprising computer hardware, a logic equivalence before and after modification to the circuit by:
        replacing a memory with a divisional memory model that agrees with the memory in number of input and output pins, wherein the divisional memory model comprises a plurality of divisional memories that have a smaller capacity than the memory and are addressed by a part of an address signal that designates an address of the memory; and
        verifying logics at an input and an output of the circuit.

6. The verification method for a semiconductor integrated circuit according to claim 5, wherein the divisional memory model comprises:
    a first logic circuit that selects from among the plurality of divisional memories according to a remaining part of the address signal;
    a delay circuit that delays the remaining part of the address signal and outputs the resulting signal; and
    a second logic circuit that selects an output from among outputs of the divisional memories according to the signal from the delay circuit and designates the selected output as an output of the whole of the plurality of divisional memories.

7. The verification method for a semiconductor integrated circuit according to claim 6, wherein in the verification, the second logic circuit whose input and output logics of the memory sub-banked remain unchanged is treated as one cell.

8. The verification method for a semiconductor integrated circuit according to claim 6, wherein the delay circuit is a flip-flop circuit.

9. A program comprising instructions stored on a non-transitory physical computer storage, the instructions configured to implement a method of performing verification of a semiconductor integrated circuit by a computer, the program comprising:
    performing, by using a verification apparatus, a verification of a logic equivalence before and after modification to the circuit is verified by:
        replacing a memory with a divisional memory model that agrees with the memory in number of input and output pins, wherein the divisional memory model comprises a plurality of divisional memories that have a smaller capacity than the memory and are addressed by a part of an address signal that designates an address of the memory; and
        verifying logics at an input and an output of the circuit.

10. The program according to claim 9, wherein the divisional memory model comprises:
    a first logic circuit that selects from among the plurality of divisional memories according to a remaining part of the address signal;
    a delay circuit that delays the remaining part of the address signal and outputs the resulting signal; and
    a second logic circuit that selects an output from among outputs of the divisional memories according to the signal from the delay circuit and designates the selected output as an output of the whole of the plurality of divisional memories.

11. The program according to claim 10, wherein in the verification, the second logic circuit whose input and output logics of the memory sub-banked remain unchanged is treated as one cell.

12. The program according to claim 10, wherein the delay circuit is a flip-flop circuit.

* * * * *